United States Patent [19]

Savage

[11] 4,390,838

[45] Jun. 28, 1983

[54] BROADBAND MEASUREMENT SYSTEM

[75] Inventor: John W. Savage, Bethesda, Md.

[73] Assignee: The United States of America as represented by the Secretary of the Army, Washington, D.C.

[21] Appl. No.: 230,558

[22] Filed: Feb. 2, 1981

[51] Int. Cl.³ .............................................. G01R 23/16
[52] U.S. Cl. ................................ 324/77 E; 324/77 D
[58] Field of Search ................ 324/77 R, 77 D, 77 E, 324/77 F

[56] References Cited

U.S. PATENT DOCUMENTS 3,469,034 9/1969 Stewart ............................ 324/77 E
3,587,097 6/1971 Stull ................................. 324/77 E

*Primary Examiner*—Michael J. Tokar
*Attorney, Agent, or Firm*—Robert P. Gibson; Jeremiah G. Murray; Michael C. Sachs

[57] ABSTRACT

A system for making emission measurements of RF electromagnetic energy, such as interference, over a relatively wide bandwidth without tuning or scanning and without the knowledge of the specific signal characteristics of the emission under consideration by receiving and detecting the emission in the circuit configuration where the ratio (r) of the impulse signal response to CW signal response is a predetermined function of the pre-detection bandwidth ($B_I$) and the post-detection bandwidth ($B_O$). More particularly, the impulse to CW signal response ratio is controlled according to the expression $r = 1/(2B_O B_I - B^2_O)^{0.5}$. Such a relationship will cause the response to all other types of emission to fall intermediate the impulse and CW signal response.

17 Claims, 4 Drawing Figures

BROADBAND MEASUREMENT SYSTEM

The invention described herein may be manufactured and used by or for the Government for governmental purposes without the payment of any royalties thereon or therefor.

BACKGROUND OF THE INVENTION

This invention relates to electrical measurements and more particularly to improved method and means for measuring the level of electromagnetic emission emanating, for example, from electrical apparatus under test operating in the RF frequency range.

Electromagnetic interference is generally defined as any electrical disturbance which causes an undesirable response or malfunction in any electronic apparatus. The interference energy can be either radiated or conducted. Radiated interference, however, constitutes a major problem due to the large number and kinds of electronic and electromagnetic apparatus that often must be grouped together in a relatively small area such as on a plane or vessel, a communication center, and a control center or the like. Any electrical, electronic or electromagnetic apparatus is adapted to generate some type of interference emission which operates to decrease the reliability efficiency and accuracy of other apparatus operating in the locality.

In order to design electronic apparatus that is not a source of and/or susceptible to undesirable interference, particularly in the form of radiation, there must be adequate means for measuring this interference. In the past, measurements had to be made which involved a complicated and laboriously time consuming procedure which were inherently inaccurate. One attempt to provide a more reliable means of making reliable interference measurements is disclosed in U.S. Pat. No. 2,952,768 entitled, "Automatic Peak Level Indicator System", which issued on Sept. 13, 1960 to H. R. Caler, et al. The circuitry described in the Caler patent involves a superheterodyne circuit having a gain control and a manually continuously adjustable frequency tuning control and a peak level indicator circuit coupled to the output of the superheterodyne circuit. While such apparatus provided an improvement over the then existing prior art, certain limitations still present themselves, namely the need for manual tuning and/or scanning.

It is an object of the present invention, therefore, to provide improved means of making emission measurements of electromagnetic energy.

It is another object of the present invention to make emission measurements of undesirable radio frequency interference over a relatively wide bandwidth without the necessity of tuning or scanning.

Still another object of the present invention is to provide a one-shot measurement of undesirable emission without the knowledge of a specific signal characteristic of the emission.

And still a further object of the present invention is to provide a measurement of electromagnetic emission on a go/no-go basis.

SUMMARY

Briefly, the foregoing and other objects of the present invention are provided by a method and apparatus for making emission measurements of electromagnetic energy, particularly in the form of interference, over a relatively wide bandwidth including one or more discrete frequency ranges by receiving and detecting the emission in one or more like circuit configurations wherein the ratio of the impulse response to CW response for each circuit is a predetermined function of the pre-detection bandwidth ($B_I$) and the post-detection bandwidth ($B_O$) and more particularly wherein the impulse to CW response ratio (r) is controlled according to expression $r = 1/(2B_O B_I - B^2_O)^{0.5}$. Each circuit is designed to cover a predetermined frequency band and is comprised of a crystal video receiver comprised of a wideband antenna, RF amplifier, pre-detection filter, crystal detector and post-detection filter, followed by a peak detector and indicator providing a go/no-go presentation of a measurement exceeding a predetermined limit. What is significant, however, is the selection of the pre-detection bandwidth and the post-detection bandwidth so that the response to wideband signals and to narrowband signals can be specified to have a predetermined response ratio whereupon the response to all those type of signals will fall intermediate the impulse and CW signal response.

DESCRIPTION OF THE PREFERRED EMBODIMENTS

The MIL-STD-461 test procedure and limits defined thereby is a typical well known test procedure utilized for, but not limited to making electromagnetic interference (EMI) measurements on U.S. Military equipment. Whereas suitable receivers are presently required for MIL-STD-461 emission measurements, the time required to make the measurements and thus the expense could be reduced if the measurements could be made with broadband, non-tunable test equipment. The present invention overcomes this problem in the following manner.

Figure 1:
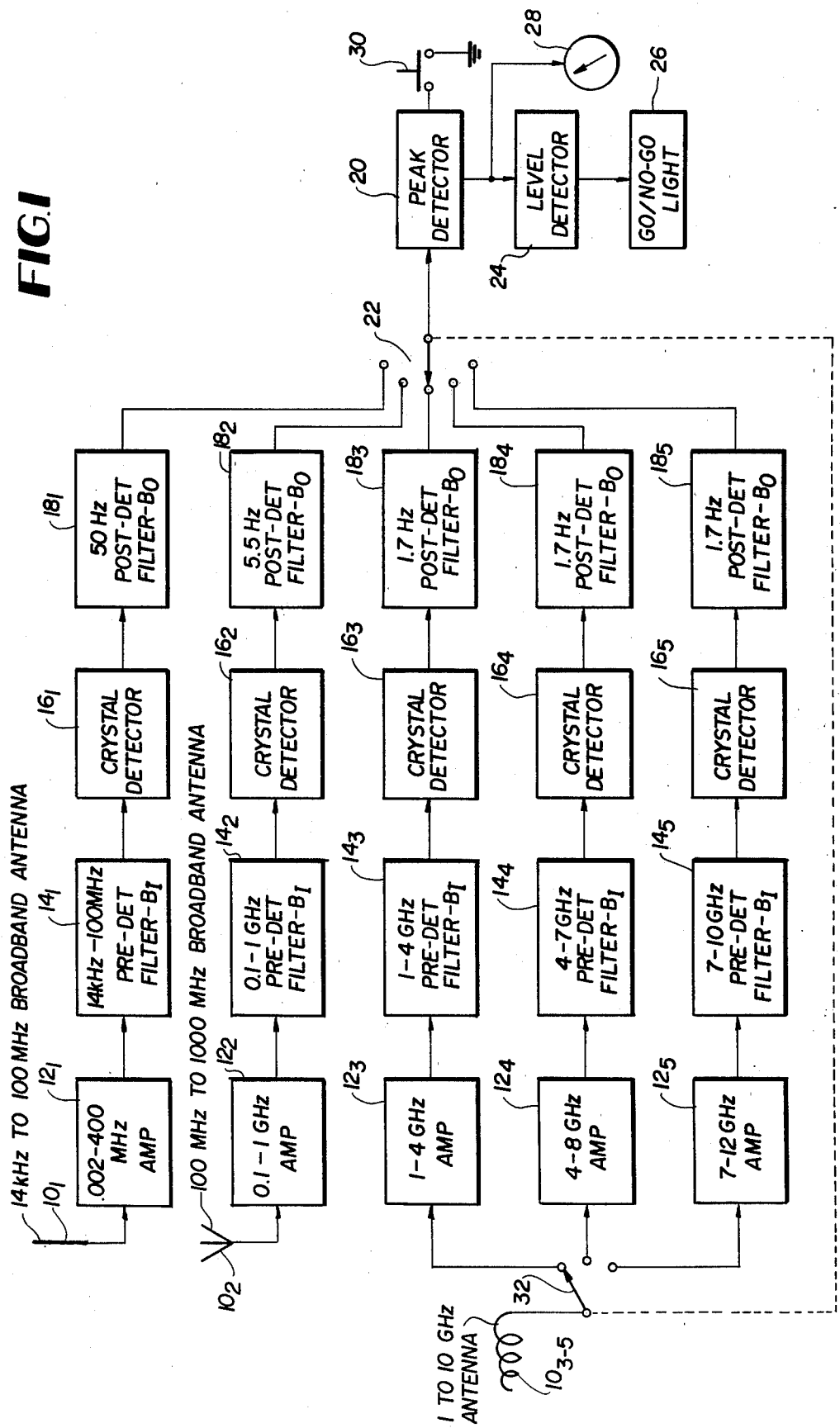
FIG. 1 is a block diagram illustrative of a multiple band circuit configuration including the invention in its preferred embodiment.

Referring now to FIG. 1, a broadband measurement system is disclosed which is adapted to cover, for example, the range from 14 kHz to 10 GHz in five discrete bands. The system is adapted to provide a go/no-go indication of the passage of EMI tests such as those required by the specifications of the aforementioned MIL-STD-461 procedure without tuning or scanning within each respective frequency band. Each band is covered by a wideband antenna 10, an RF amplifier 12, a predetection filter 14, a crystal detector 16, and a post-detection low pass filter 18 feeding into a common peak detector 20 through a band selector switch 22 with the output of the peak detector being fed to a level detector 24 whose output is coupled to a go/no-go indicator device 26 consisting of, for example, a light. Additionally, a power meter 28 is shown connected to the output of the peak detector 20. Also shown connected to the peak detector 20 is a puch-button switch 30 which is used as a means of resetting the peak detector following the making of a measurement.

The amplifier, filter, crystal detector circuit portions of each of the five (5) bands are designated by the subscripts 1 through 5. Whereas separate antennas $10_1$ and $10_2$ are shown coupled to the amplifiers $12_1$ and $12_2$, respectively, a single antenna $10_{3-5}$ is adapted to be coupled to the amplifiers $12_3$, $12_4$ and $12_5$ through multiple contact switch 32 which is mechanically ganged to the switch 22 which couples the output of the post-detector filters $18_1 \ldots 18_5$ to the peak detector 20. While the system shown in FIG. 1 is adapted to make radiated emission measurements, conducted emission measurements can be obtained by replacing the antennas $10_1$, $10_2$ and $10_{3-5}$ with suitable wideband probes, not shown. When desirable, simultaneous coverage of all five bands can be obtained by the utilization of a multiplexer, not shown, coupled between the antenna elements and the respective RF amplifiers. In the embodiment shown in FIG. 1, however, the frequency range from 14 kHz to 10 GHz is covered in five steps as determined by the position of the gang switches 22 and 32 which may be manually or mechanically driven by driving means, not shown.

The two antennas $10_1$ and $10_2$ which are adapted to cover the ranges from 14 kHz to 100 MHz and 100 MHz to 1000 MHz, respectively, are preferably comprised of active antennas incorporating FET amplifiers, not shown, in their bases to accomplish predetermined impedance transformation and/or pre-amplification. Unlike passive antennas, active antennas contribute amplifier noise to the system and must be used with care to avoid saturation by strong signals. An active antenna, however, can provide a flat frequency response needed by the subject broadband system at lower frequencies. Typically, the antenna $10_1$ comprises a type TW-2/A antenna manufactured by Duntech Industries and physically comprises a 64 inch rod standing over a ground plane of 18 inch radials. The second antenna $10_2$ typically is a type SP-1/B antenna also manufactured by Duntech Industries and comprises a biconical antenna which is 22 inches high by 38 inches in diameter. When desirable, the two antennas $10_1$ and $10_2$ can be replaced by a single type SP-1/B which is adapted to cover the range from 20 Hz to 1 GHz. The single antenna $10_{3-5}$ which is adapted to cover the three bands of 1 GHz–4 GHz, 4 GHz–8 GHz, and 7 GHz–12 GHz typically is a type 3102 conical log spiral antenna manufactured by EMCO and comprises a circularly polarized cone approximately three feet long and a foot in diameter at its base.

Insofar as the amplifiers $12_1 \ldots 12_5$ are concerned, they are comprised of wideband amplifiers whose characteristics are shown in Table I below.

TABLE I

| | Amplifier Characteristics | | | | | |
|---|---|---|---|---|---|---|
| Amp | Manufacturer | Model | Freq. Response | Noise Fig. | Gain | Pwr. Output |
| $10_1$ | Avantek | AWL-500 or AV-8 | .001–500MHz .002–400 | 5.0dB 10.0 | 25dB 30 | +5 dBm +29 |
| $10_2$ | Avantek | AMT-1003 or AWP-1000 | 100–1000 10–1000 | 4.5 7.5 | 28 30 | +6 +23 |
| $10_3$ | Avantek | AMG-4010 or AMG-4053 | 1000–4000 1000–4000 | 4.5 4.8 | 32 25 | +12 +15 |
| $10_4$ | Avantek | AMT-8033 or AMT-8054 | 4000–8000 4000–8000 | 4.5 5.5 | 27 28 | +13 +20 |

TABLE I-continued

| | Amplifier Characteristics | | | | | |
|---|---|---|---|---|---|---|
| Amp | Manufacturer | Model | Freq. Response | Noise Fig. | Gain | Pwr. Output |
| $10_5$ | Avantek | AMT-12018 | 7000–12000 | 6.0 | 58 | +13 |

Deferring consideration of the pre-detection filters $14_1 \ldots 14_5$ for a moment, the crystal detectors $16_1 \ldots 16_5$ in the broadband measurement system of the present invention are typically comprised of well known point contact diodes or low-barrier Schottky diodes or similar non-linear impedance devices which exhibit an average detector characteristic as opposed to a peak detector characteristic. The average type detector is preferred over the peak detector due to the fact that the peak detector has essentially zero video bandwidth characteristic with the output being a DC level proportional to the peak of any input signal which comes along whether it occurs repeatedly as do the peaks of a sine wave or only occasionally as to impulses. A true peak detector, moreover, is difficult to realize for an impulse signal for a bandwidth greater than a few magahertz because there is insufficient time to fully charge a storage capacitor normally included therein. Narrowband signals do not have this problem because the storage capacitor charge can be built up over several cycles. The average detector on the other hand has a video bandwidth equal to the RF bandwidth and as such the output of the detector is an accurate rectified replica of the input. The averaging type of detector has the advantage over the peak detector in that the ratio of the broadband response is represented by an impulse signal to the narrowband response is represented by a CW signal can be controlled by the ratio of the pre-detection bandwidth to the post-detection bandwidth which is effected by the bandwidths $B_I$ and $B_O$ of the filters $14_1 \ldots 14_5$ and $18_1 \ldots 18_5$, respectively and which further goes to the heart of the inventive concept of the present invention as will be shown.

Considering now briefly the peak detector 20 and the go/no-go indicator 26, the peak detector includes the peak-hold circuit, not shown, whose value is adapted to be displayed on the meter 28 which is calibrated, for example, in dB relative to the specification limit under consideration, namely the MIL-STD-461 specification limit suitably modified. The purpose of the level indicator 24 is to energize the indicator lamp 26 when the modified MIL-STD-461 specification limit is exceeded for a specific set of parameters. As noted earlier, the push-button 30 is adapted to provide a reset function. The peak-hold circuit referred to but not shown can be accomplished with analog circuitry or by digitizing at a sample rate at least twice the post-detection bandwidth $B_O$. The digital approach has the advantage of being able to accomplish an indefinite peak-hold function without drift problems.

Considering now the heart of the invention, given any crystal video receiver comprised of an RF amplifier with sufficient gain that the amplifier noise figure F determines the system noise figure, a pre-detection filter of bandwidth $B_I$, a square law crystal detector, a post-detection filter of bandwidth $B_O$ which is embodied in each of the five band circuits shown in FIG. 1, the input signal level required for a zero dB signal to noise ratio S/N at the output will be derived for purposes of illustration in order to obtain an optimum impulse/CW signal response ratio specified in terms of the pre-detection bandwidth $B_I$ and the post-detection bandwidth $B_O$.

Figure 2:
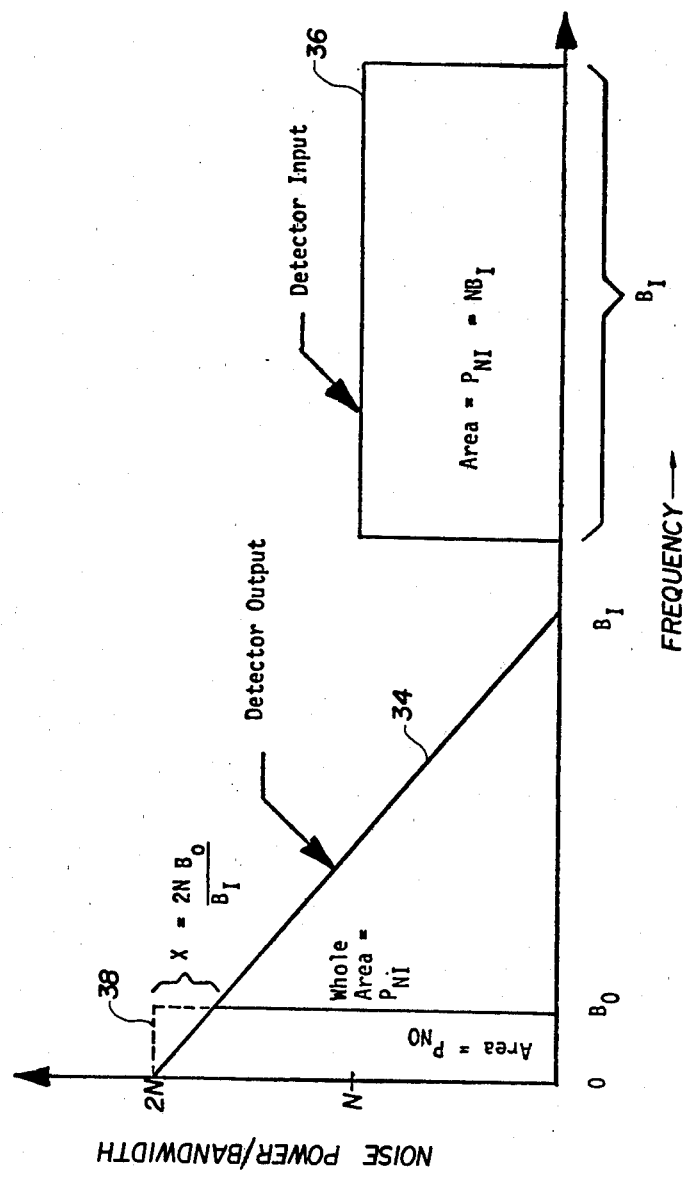
FIG. 2 is a graph helpful in understanding the subject invention.

Considering first the sensitivity to CW signals, a square law detector with a band-limited Gaussian noise input of power N watts/Hz is assumed to have as its output a triangular noise distribution caused by noise components interacting with noise components (N)×(N) noise, as shown in FIG. 2. The area of the triangle 34 and the area of the rectangle 36 are both proportional to the noise input power $P_{NI}$. Since the bandwidth for both is the pre-detection bandwidth $B_I$, the height of the triangle 34 at zero frequency is twice that of the rectangle 36. The area 38, $P_{NO}$, of that portion of the triangle representing the noise power which passes through the post-detection bandwidth $B_O$ can be expressed as:

$$P_{NO} = 2 NB_O - (XB_O/2) \qquad (1)$$

$$= \frac{2 NB_O B_I - NB_O^2}{B_I}$$

The detection bandwidth ratio, b, which determines the portion of the noise input power $P_{NI}$ which appears in the output as $P_{NO}$ is:

$$b = P_{NO}/P_{NI} = P_{NO}/NB_I \qquad (2)$$

from which:

$$b = \frac{2 B_O B_I - B_O^2}{B_I^2} \qquad (3)$$

Because of the square law detector characteristics the signal output power $P_{SO}$ and the noise output power $P_{NO}$ are the squares of the corresponding inputs, such that:

$$P_{SO} = (CP_{SI})^2 \qquad (4)$$

and $$P_{NO} = b(CNB_I)^2 \qquad (5)$$

where C is a detector sensitivity constant (V/W). At threshold, $P_{SO} = P_{NO}$ and accordingly:

$$(CP_{SI})^2 = b(CNB_I)^2 \qquad (6)$$

$$= \frac{(2 B_O B_I - B_O^2)(CNB_I)^2}{B_I^2}$$

whereupon $$P_{SI} = N(2B_O B_I - B_O^2)^{0.5} \qquad (7)$$

The above sensitivity analysis does not take into account the additional input noise transferred to the output in the presence of the signal because of signal components interacting with noise components ((S)×(N) noise). The noise output from a detector increases when a signal appears, leading to what has been termed the "small-signal suppression effect." For a detector operating at full bandwidth, i.e. $B_O = B_I$, a 5 dB RMS input S/N is typically required for a zero dB RMS output S/N. However, when $B_O$ is much smaller than $B_I$, which is the case of interest here, the concentration of (N)×(N) noise near zero frequency, as represented by the triangular noise distribution (FIG. 2) in the detector output tends to swamp out the effect of (S)×(N) noise so that it can be neglected for the present.

With regard to impulse sensitivity on the other hand an impulse signal (a pulse sufficiently short that the energy is constant across the input bandwidth $B_I$) is assumed to react in a square law detector much the same as noise in that the detector output pulse power distribution $P_{IO}$ is also triangular as shown in FIG. 2 because impulse components interact with impulse components ((I)×(I) components) to concentrate energy near zero frequency. Unlike noise, the impulse components are correlated so that peak voltage as well as power is directly proportional to bandwidth. This leads to the calibration of impulse generators in units of V/Hz, or dbuV/MHz.

A suitable threshold criteria for evaluating the sensitivity of a crystal video receiver to impulses is that the peak voltage of the impulse output $V_{IO}$ equals the peak voltage of the noise output $V_{NO}$. Experimental data obtained by observing noise with a known RMS value indicate that:

$$V_{NO} = 3(R_O P_{NO})^{0.5} = 3(RMS \text{ value}) \qquad (8)$$

when most of the frequency occurring peaks are included. $R_O$ is the video load resistance.

Narrowband Gaussian noise has a Rayleigh envelope distribution for which the probability P that a given level R is exceeded is given by:

$$p = e^{\frac{-R^2}{2}} \qquad (9)$$

The RMS value of the distribution corresponds to $R = \sqrt{2}$. Levels 3 times the RMS value will be exceeded with a probability of $$P = e^{-(3\sqrt{2})^2/2} = 0.0001 \qquad (10)$$

Another way of considering it is that noise peak voltage will be less than three times the RMS voltage noise 99.99 percent of the time. The probability that the threshold will be exceeded must be small if a peak-hold circuit is to be used at the output to provide a go/no-go indication.

For a square law detector, the peak impulse voltage output $V_{IO}$ is related to the impulse input, I, in the RMS volts per hertz, by:

$$V_{IO} = Cb(\sqrt{2}IB_I)^2/R_I \qquad (11)$$

and the Rayleigh noise output peak voltage, $V_{NO}$, is related to the Gaussian input noise, N, in watts per hertz by:

$$V_{NO} = 9\sqrt{b}CNB_I \qquad (12)$$

Using the variables as previously defined above, at threshold:

$$V_{IO} = V_{NO} \qquad (13)$$

and $$Cb(\sqrt{2}IB_I)^2/R_I = 9\sqrt{b}CNB_I \qquad (14)$$

whereupon the threshold impulse signal I can be expressed as:

$$I = \left[\frac{4.5 \, NR_I}{\sqrt{b} \, B_I}\right]^{0.5} \quad (15)$$

$$= \left[\frac{4.5 \, NR_I}{(2B_OB_I - B_O^2)^{0.5}}\right]^{0.5}$$

Because of the norms established in MIL-STD-461 and elsewhere, it is desirable that any broadband measurement system allow a higher limit for broadband emissions in dBuV/MHz than for narrowband emissions in dBuV. Broadband measurement systems are inherently more sensitive to broadband interference than narrowband systems and, when the system bandwidth exceeds 1 MHz, can be numerically more sensitive to broadband interference than to narrowband interference. Thus, if the broadband measurement system according to the subject invention is to make measurements without having to be recalibrated for each type of interference, the broadband response must be reduced by a known amount relative to the narrowband response. This is accomplished by controlling the pre-detection to post-detection bandwidth ratio r.

Figure 3:
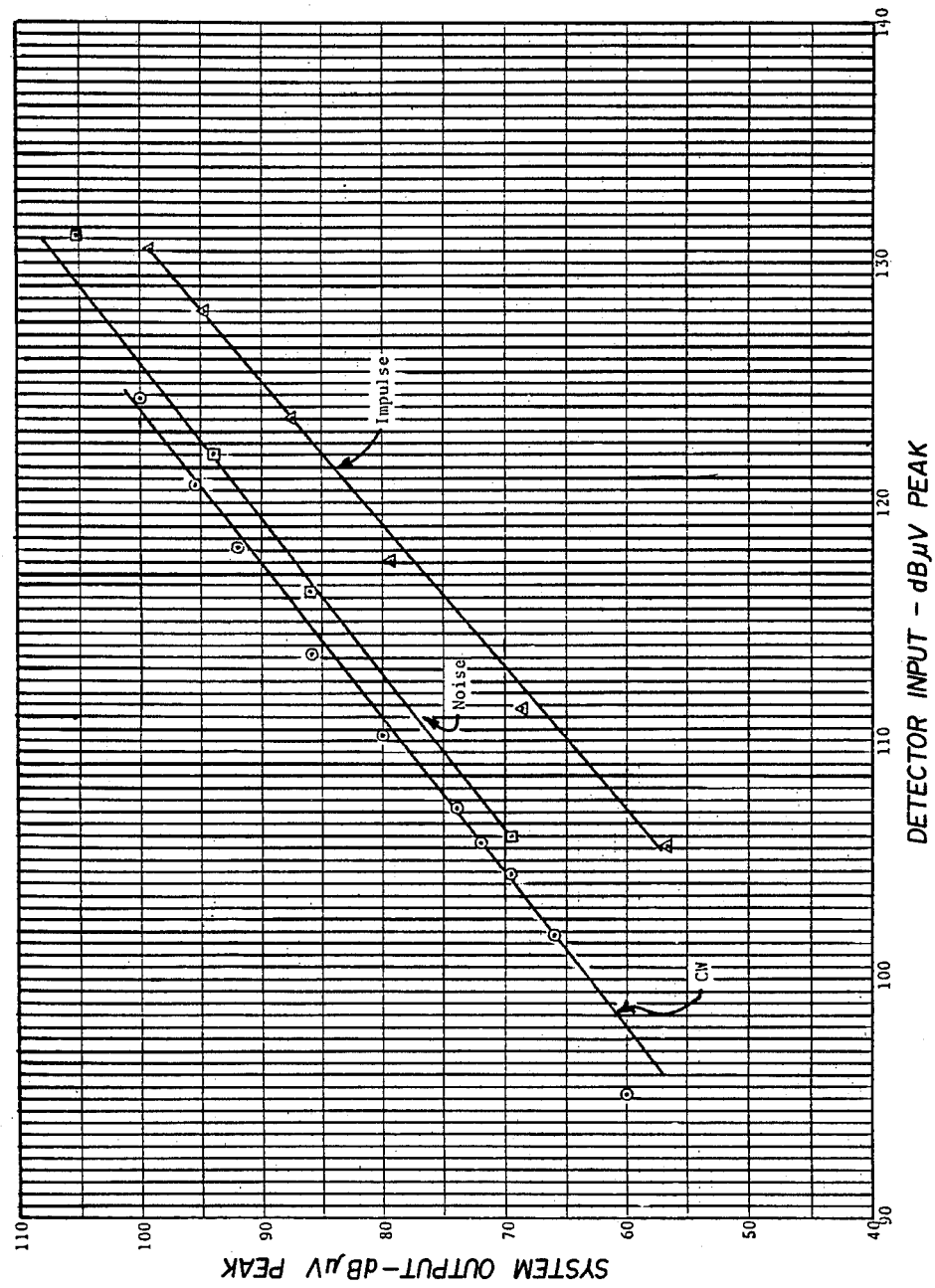
FIG. 3 is a graph illustrative of the operational characteristic of the subject invention.

Taking CW as the worst-case (narrowest bandwidth) narrowband interference and an impulse as the worst-case broadband interference, the peak output from the detector can be expressed as:

$$V_{SO} = 2CP_{SI} = C(\sqrt{2}V_{SI})^2/R_I \quad (16)$$

and $$V_{IO} = Cb(\sqrt{2}IB_I)^2/R_I \quad (17)$$

where $V_{SI}$ is a CW signal in RMS microvolts and I is an impulse signal in RMS microvolts/MHz. For equal outputs wherein $V_{SO} = V_{IO}$, the required inputs are:

$$C(\sqrt{2}V_{SI})^2/R_I = bC(\sqrt{2}IB_I)^2/R_I \quad (18)$$

and $$V_{SI} = \sqrt{b}IB_I \quad (19)$$

whereupon the impulse/CW response ratio r can be expressed as:

$$r = \frac{I}{V_{SI}} = \frac{I}{\sqrt{b} \, B_I} = \frac{I}{(2B_OB_I - B_O^2)^{0.5}} \quad (20)$$

where $B_O$ and $B_I$ are in MHz if I is in uV/MHz and $V_{SI}$ is in uV. And accordingly, once $B_I$ and $B_O$ have been selected, all other types of RF interference such as uncorrelated noise and complex mixtures will have r values falling between CW and impulses as shown in FIG. 3.

Figure 4:
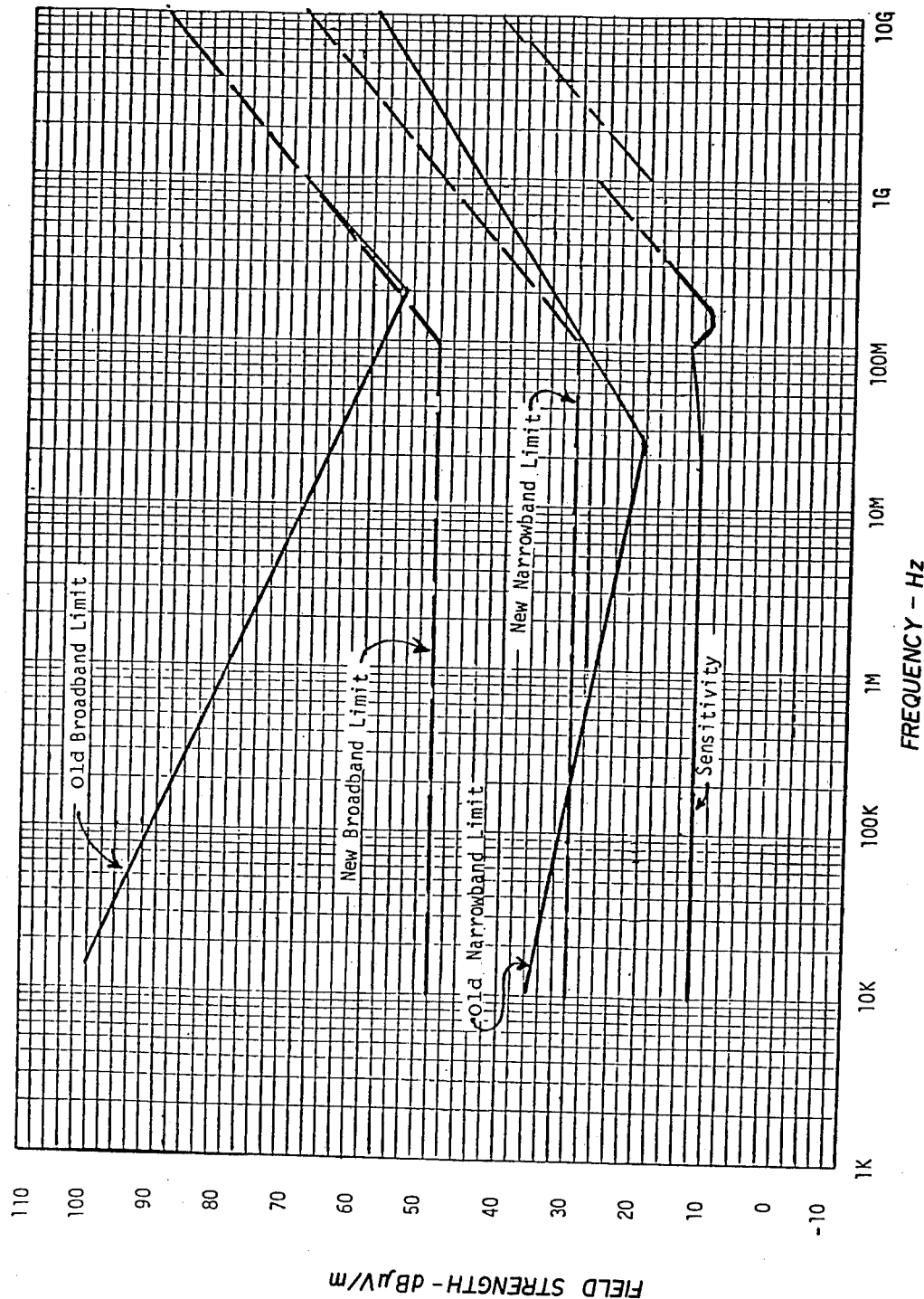
FIG. 4 is a graph illustrative of the operational characteristic of the subject invention in relation to prior art practice.

Heretofore, the MIL-STD-461 technique has allowed a numerically higher limit on radiated broadband emissions than on radiated narrowband emissions. This is shown by the curves shown in FIG. 4 labeled "old broadband limit" and "old narrowband limit". This is particularly due to the fact that the standard narrowband measurement equipment has bandwidth considerably less than 1 MHz, making it inherently less sensitive in broadband units of dbuV/MHz than in narrowband units of dBuV and partially due to the fact that broadband emissions generally have less interference effect than narrowband emissions of equivalent peak value. However, the present invention teaches that the broadband to narrowband response can be established in a broadband measurement system by controlling the ratio of the pre-detection to post-detection bandwidths in a predetermined manner. Thus if the limit curves are modified to those designated "new broadband limit" and "new narrowband limit" as shown in FIG. 4, measurements can be made by a broadband measurement system in accordance with the MIL-STD-461 specification without tuning and without specific knowledge of the characteristics of the signals measured. Although an r of 20 db is shown in FIG. 4, when desired other values can readily be established.

Also when desired, the operable frequency range may be extended by the addition or extension of one or more band circuits including an amplifier $12_n$, a pre-detection filter $14_n$, a crystal detector $16_n$ and a post-detection filter $18_n$. The frequency range may also be extended by heterodyne techniques of frequency translation which is particularly useful above 10 GHz.

Thus what has been shown and described is a broadband measurement system for making emission measurements of electromagnetic energy over a relatively wide bandwidth in accordance with a specification like or similar to MIL-STD-461 but without the requirement of tuning or scanning and without the knowledge of the specific signal characteristics by receiving and detecting the emission under test in at least one circuit configuration wherein the ratio of the impulse response to the CW response is a function of the pre-detection bandwidth and the post-detection bandwidth.

While the invention has been particularly shown and described with reference to a preferred embodiment thereof, it is to be understood that the foregoing and other changes in form and details may be made without departing from the spirit and scope of the invention as set forth in the subtended claims.

What is claimed is:

1. A method of measuring the emission of electromagnetic energy over a relatively wide bandwidth comprising the steps of:
   receiving electrical signals of said emission;
   applying said signals to a detection circuit having a response characteristic where the ratio of the impulse signal response to the CW signal is a predetermined function of said detection circuit defined by the relationship:

$$r = 1/(2B_OB_I - B^2_O)^{0.5}$$

wherein r is the ratio of the impulse signal response to the CW signal response, $B_I$ is the pre-detection bandwidth of said detection circuit, and $B_O$ is the post-detection bandwidth of said detection circuit;
   detecting said electrical signals in said detection circuit and providing video output signals therefrom; and
   applying said video output signals to a measuring circuit operative to determine the amplitude of said video output signals.

2. The method as defined by claim 1 wherein said step of applying said video output signals to a measuring circuit comprises applying said video signals to a peak detector circuit and thereafter applying the output of the peak detector circuit to an indicator circuit.

3. The method as defined in claim 2 wherein said step of applying the output of said peak detector to said indicator circuit additionally includes first applying said output to a level detector having a predetermined threshold value, and thereafter applying the output of the level detector to the indicator circuit and wherein said indicator circuit comprises a go/no-go indicator operative in response to the output of said level detector.

4. The method as defined by claim 2 wherein said method of applying said video output signals to a measuring circuit includes coupling the output of the peak detector to a signal power meter.

5. The method as defined by claim 1 and wherein said receiving step additionally includes the step of heterodyning the received electrical signals to effect a frequency translation and thereby extend the measurement frequency range.

6. A system for making emission measurements of electromagnetic energy in accordance to specifiable narrow and broadband limits over a relatively wide bandwidth without tuning or scanning within one or more predetermined frequency bands and without the knowledge of the specific signal characteristic of said energy, comprising:
crystal-video receiver apparatus for each frequency band, said receiver apparatus having a selected pre-detection bandwidth and a selected post-detection bandwidth wherein the ratio of the wideband signal response to the narrowband signal response r is defined by the expression:

$$r = 1/(2B_O B_I - B^2_O)^{0.5}$$

where $B_I$ is the pre-detection bandwidth and $B_O$ is the post-detection bandwidth.

7. The system as defined by claim 6 wherein said receiver apparatus further comprises:
electromagnetic energy pick up means;
circuit means coupled to said pick up means for providing said pre-detection bandwidth;
first detector means coupled to said circuit means providing said pre-detection bandwidth and providing a video signal from the received energy;
circuit means coupled to said first detector means for providing said post-detection bandwidth;
second detector means coupled to said circuit means providing said post-detection bandwidth and providing a signal indicative of the level of said video signal; and
indicator means coupled to said second detector means for providing a visual indication of the output of said second detector means.

8. The system as defined in claim 7 wherein said electromagnetic energy pick up means comprises relatively wideband antenna means.

9. The system as defined by claim 7 wherein said circuit means providing said pre-detection bandwidth includes pre-detection filter circuit means.

10. The system as defined by claim 9 wherein said circuit means providing said pre-detection bandwidth additionally includes signal amplifier means coupled between said pick-up means and said pre-detection filter means.

11. The system as defined by claim 7 wherein said circuit means providing said post-detection bandwidth includes low pass filter circuit means.

12. The system as defined by claim 7 wherein said second detector includes peak detector circuit means and additionally including level detector circuit means coupled thereto for outputting a signal when the amplitude of said signal output from said peak detector means exceeds a predetermined level, and wherein said indicator means is responsive to the output of said level detector circuit means to provide a go/no-go indication.

13. The system as defined by claim 7 wherein said electromagnetic energy pick up means comprises an active antenna having a relatively flat frequency response over a wide band of frequencies.

14. The system as defined by claim 7 wherein said electromagnetic energy pick up means comprises electrical probe means directly connected to electrical apparatus under test.

15. The system as defined by claim 7 wherein said first detector means comprises a non-linear impedance device.

16. The system as defined by claim 7 wherein said first detector means comprises a crystal detector.

17. The system as defined by claim 16 wherein the crystal detector is adapted to provide an average DC value output in response to the input energy coupled thereto.

* * * * *